United States Patent [19]

Sang et al.

[11] Patent Number: 4,749,942
[45] Date of Patent: Jun. 7, 1988

[54] WAFER PROBE HEAD

[75] Inventors: Emmanuel Sang, Portland, Oreg.; Gary L. Estabrook, Vancouver, Wash.

[73] Assignee: Tektronix, Inc., Beaverton, Oreg.

[21] Appl. No.: 57,723

[22] Filed: Jun. 2, 1987

Related U.S. Application Data

[63] Continuation of Ser. No. 781,153, Sep. 26, 1985, abandoned.

[51] Int. Cl.[4] .................. G01R 31/02; G01R 1/06
[52] U.S. Cl. .................. 324/158 P; 324/158 F; 324/73 PC
[58] Field of Search ........... 324/158 F, 158 P, 73 PC, 324/72.5

[56] References Cited

U.S. PATENT DOCUMENTS

| | | | |
|---|---|---|---|
| 3,446,065 | 5/1969 | Wiesler et al. | 73/105 |
| 3,849,728 | 11/1974 | Evans | 324/158 F |
| 4,116,523 | 9/1978 | Coberly et al. | 324/158 P |
| 4,219,771 | 8/1980 | Reid et al. | 324/158 F |
| 4,574,235 | 3/1986 | Kelly et al. | 324/158 F |
| 4,686,463 | 8/1987 | Logan | 324/158 P |

OTHER PUBLICATIONS

Bailey et al.; "A Neutron Hardness Assurance Screen Based on High Frequency Probe Measurements"; IEEE Transactions on Nuclear Science, vol. NS. 23, No. 6, Dec. 1976; p. 2023.
Byrnes et al., "Self Measurement of Probe Deflection in a Semiconductor Test System", IBM Technical Disclosure Bulletin; vol. 20, No. 1, Jun. 1977; p. 166.
"Introducing the World's first Microwave Wafer probing Equipment"; Cascade Microwave; 1983; pp. 1-3.

Primary Examiner—Reinhard J. Eisenzopf
Assistant Examiner—Vinh P. Nguyen
Attorney, Agent, or Firm—Francis I. Gray; John Smith-Hill

[57] ABSTRACT

A wafer probe head has a plate-form support member having a tip region and a mounting region. At least one electrically conductive probe tip is carried by the support member at the tip region. A connector is carried by the support member at a location spaced from the tip region, and the probe tip is electrically connected to the connector. The probe head also has a strain gauge for measuring physical distortion of the support member as a result of the probe tip being pressed against a device under test by virtue of relative movement between the mounting region of the support member and the device under test.

7 Claims, 2 Drawing Sheets

WAFER PROBE HEAD

This is a continuation of application Ser. No. 781,153 filed Sept. 26, 1985 and now abandoned.

This invention relates to a wafer probe head and a method of assembling a wafer probe head.

BACKGROUND OF THE INVENTION

A known surface acoustic wave (SAW) device comprises a substrate of piezo-electric material having two input transducers and two output transducers on its upper surface. Each transducer has a generally rectangular contact pad, to which electrical contact is made by wire bonding. The four pads are arranged in a rectangular array, rather than being collinear.

SAW devices are made using several of the techniques that are employed in the manufacture of integrated circuits, and for this reason it is conventional to fabricate a large number of SAW devices, e.g. 100 or more, concurrently on a wafer or substrate material and then dice the wafer and package and individual SAW devices. The SAW devices could be tested after dicing and packaging, using the bond wires to achieve electrical connection to the devices. However, for reasons that are well understood by those skilled in the art, it is desirable that the SAW devices be tested in wafer form, i.e. prior to dicing.

A wafer prober developed for use in testing integrated circuits in wafer form comprises a stage or table defining an X-Y plane on which the wafer is placed, a probe head having probe tips for engaging the contact pads of an individual integrated circuit, and a drive mechanism for moving the probe head in the X, Y and Z directions. The drive mechanism is programmed with respect to the pitch of the integrated circuits in the X and Y directions, and on initial set-up the probe head is positioned in the Z direction so that the probe tips engage the contact pads of a given integrated circuit with a force that is considered by the operator of the machine to be acceptable. This position establishes the Z axis adjustment of the prober. In use, the prober drive mechanism automatically advances the probe head from die to die by raising the probe head, moving it in the X and/or Y direction, and lowering it in the Z direction to the position established on initial set-up.

The conventional wafer prober has no means for determining the force with which the probe tips are applied to the integrated circuit contact pads. If the operator makes an error on initial set-up, the contact pressure might be too high, resulting in the wafer and/or the probe head being damaged. If the conventional wafer prober is used in the testing of SAW devices, the absence of reliable means for measuring contact force implies that the contact force will vary from wafer to wafer, and may vary from die to die if the upper surface of the wafer does not lie accurately perpendicular to the Z axis. Since SAW devices are pressure-sensitive, variation in contact force may result in spurious measurement results.

Conventional integrated circuit dice are rectangular in form and may have 20 or more contact pads along each of the four sides. The contact pads along a given side are in a linear array. Conventional wafer probers for integrated circuits employ four probe heads, associated with the four sides respectively of a die. The probe head described in U.S. patent application Ser. No. 672,846 filed Nov. 16, 1984 comprises a platelike support member of ceramic material, the support member being sufficiently thin to bend somewhat. The probe tips of each probe head are arranged in a linear array and may be, for example, gold beads. The malleability of the gold and the limited flexibilty of the support member allow contact to be made to each of the contact pads with a reasonable degree of reliability. In a SAW device, in which there are relatively few contact pads, it is desirable to use a single probe head, but because the contact pads are not collinear the flexibility of the support member cannot compensate for possible deviations of the plane containing the probe surfaces of the probe tips from its nominal orientation. Moreover, whereas the contact pad material of conventional integrated circuits is frequently gold, it is common to use aluminum for the contact pads in a SAW device, and therefore it is desirable that the probe tips be made of a hard, non-malleable metal, such as nickel, in order to penetrate the passivation layer that forms on the aluminum contact pads.

SUMMARY OF THE INVENTION

In accordance with a preferred embodiment of a first aspect of the present invention, a wafer probe head has a plate-form support member of dielectric material with a tip region and a mounting region. An electrically conductive probe tip is carried by the support member at the tip region, and a connector is carried by the support member at a location spaced from the tip region. The probe tip is electrically connected to the connector. Means are provided for measuring physical distortion of the support member as a result of the probe tip being pressed against a device under test by virtue of relative movement between the mounting region and the device under test.

In its second aspect, the present invention is concerned with a method of assembling a wafer probe head having a plate-form support member with a tip region and a mounting region and also having a mounting structure secured to the support member at the mounting region and defining a first datum plane. In a preferred embodiment of the method at least two probe tips are inserted into respective passageways, each having a boundary that engages respective probe surfaces of the probe tips and is in a predetermined position relative to a second datum plane. The first end of the support member is brought close to the probe tips and the first datum plane is brought into a predetermined position relative to the second datum plane. The probe tips are attached to the support member whereby the probe surfaces of the probe tips are secured in predetermined respective positions relative to the first datum plane.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
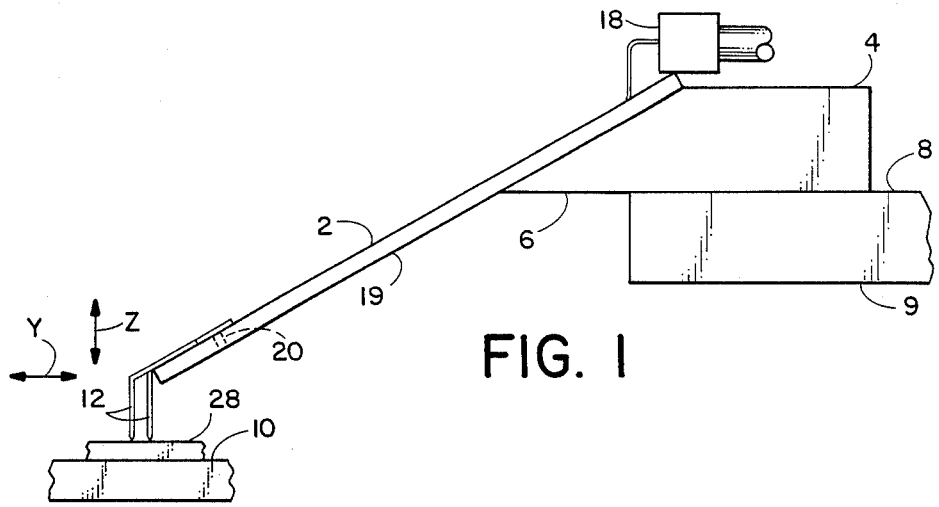
FIG. 1 is a side elevation of a wafer probe head fitted in an automatic wafer prober.
Figure 2:
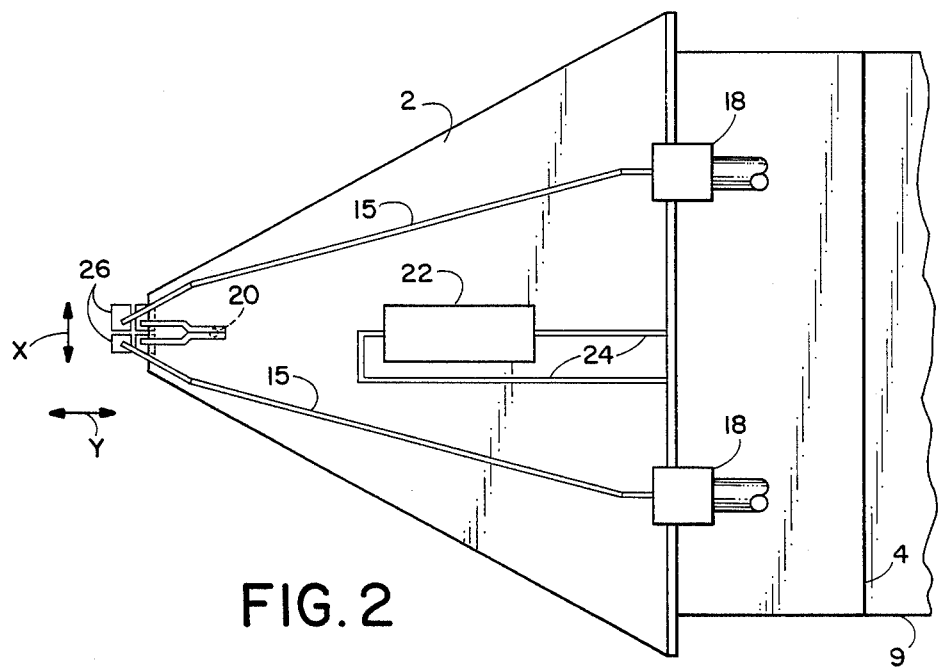
FIG. 2 is a plan view of the probe head.
Figure 3:
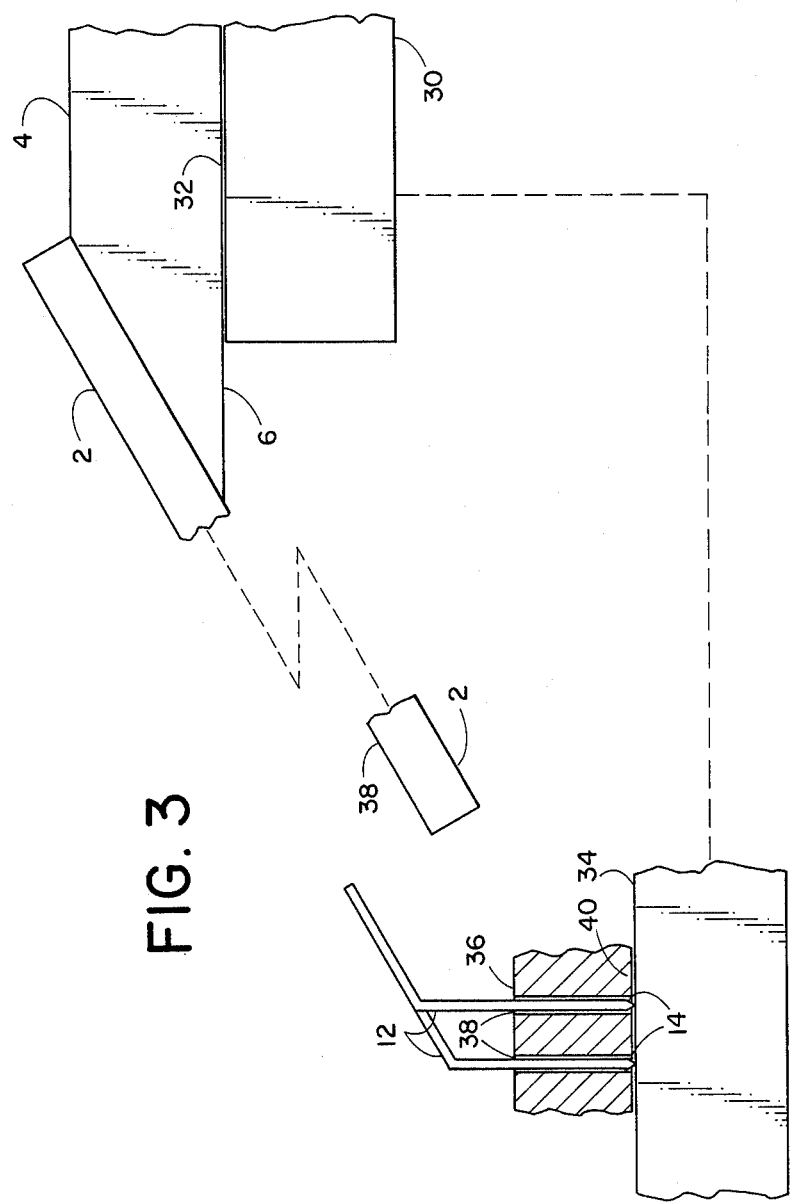
FIG. 3 is an enlarged side elevation illustrating the assembling of the probe head.

The probe head shown in FIGS. 1 and 2 is used for testing SAW devices. The probe head has a support plate 2 of alumina ceramic material and a mounting block 4 to which the plate 2 is secured, for example by means of adhesive material. The block 4 has a lower surface 6 which, in use, engages the upper surface 8 of a structure 9 for mounting the probe head in a wafer prober. The surface 8 is maintained accurately parallel relative to the upper surface 10 of the table of the prober. The probe head also comprises four probe tips 12. The probe tips are made of nickel and are pointed, as shown at 14 (FIG. 3). The lower portion of each probe tip is straight, and the lower ends of the tips are coplanar and are arranged in a rectangular array. Two of the probe tips are soldered to respective 50 ohm microstrip conductors 15, which are connected in conventional manner to the core conductors of respective coaxial connectors 18. The underside 19 of the support member 2 is metallized and is connected in conventional manner to the shield conductors of the connectors 18 and thus serves as a ground plane. The ground plane is connected through a metallized through-hole 20 to the other two probe tips 12. A thick film piezo-electric transducer 22 is formed on the upper surface of the plate member 2 and is connected by means of wires 24 and other conductors (not shown) as one leg of a resistance bridge circuit. The transducer 22 thus serves as a strain gauge. The output of the bridge circuit is connected to a circuit for controlling the Z axis movement of the mounting structure 9 of the prober. Thus, in use, the structure 9 is moved in the Z direction to bring the lower ends 14 of the probe tips 12 into contact with the contact pads 26 of a device under test (DUT) 28. When the ends 14 engage the pads of the DUT, the plate member 2 bends somewhat, and this affects the resistance value of the transducer 22. The bridge circuit is calibrated so that it is in balance (zero output voltage) when the contact force has a predetermined set value, e.g. about 1.4 kg. Assuming that the output voltage is positive when the contact force is less than the set value, the control circuit for Z axis movement advances the probe head in the Z direction until the output voltage falls to zero. When the output voltage becomes equal to zero, movement in the Z direction is stopped, and the desired test is carried out on the DUT.

It will be seen that the use of the transducer 22 makes it possible to carry out a succession of measurements without there being substantial change in the contact force from measurement to measurement, independently of the actual position in the Z direction of the structure 8 relative to the table 10.

FIG. 3 illustrates the manner in which the probe tips 12 are attached to the plate member 2. The mounting block 4, with the plate member 2 attached thereto, is bolted to a plate 30 having a horizontal upper surface 32. A block 34 is connected to the plate 30 in a manner permitting relative linear movement parallel to the plane of the surface 32 but preventing relative linear movement perpendicular to the plane of the surface 32 and also preventing relative rotational movement about axes in the plane of the surface 32. The upper surface of the block 34 is parallel to the surface 32. A plate 36 has four holes 38 drilled through it, perpendicular to its lower surface 40. The plate 36 is attached to the block 34, with the surface 40 in contact with the upper surface of the block 34, so that the holes 38 are normal with respect to surface 40. The probe tips that are to be attached to the support member 2 are inserted in the holes 36, and the block 34 is moved relative to the plate 30 in the X-Y plane to position the upper ends of the probe tips against the tip region of the support member 2. When the desired relative positions are achieved, the probe tips are soldered to the support member. The mounting block 4 can then be detached from the plate 30 and the probe tips withdrawn from the holes 36. The holes 38 are only slightly larger in diameter than the probe tips 12. For example, if the probe tips are 10 mil (1 mil is 0.001 inch, or about 0.025 mm) in diameter, the holes may be 10.5 mil in diameter. The plate 36 is about 100 mil thick, and the tapering of the pointed ends 14 of the probe tips 12 is steep. Therefore, when the probe tips are inserted in the holes, they are accurately collimated by virtue of the small clearance between the probe tips and the surfaces bounding the holes, and by virtue of the relationship between the diameter of the probe tips and the length over which lateral movement of the probe tips is restricted. Moreover, the points of the probe tips are coplanar, and the common plane of the points is parallel to the surface 32.

The relative positions of the holes 38 in the plate 36 are such that the points of the probe tips are positioned to contact the pads of the DUT. Moreover, by appropriate selection of the distance between the probe tips that are grounded and the probe tips that are connected to the conductors 15, a uniform 50 ohm characteristic impedance can be maintained from the connectors 18 right down to the points of the probe tips.

It will be appreciated that the present invention is not restricted to the particular method and apparatus that have been described, and that variations may be made therein without departing from the scope of the invention as defined in the appended claims, and equivalents thereof. For example, the technique of measuring the contact force of the probe tips against the DUT and controlling Z axis movement in dependence upon the contact force, is independent of the method of achieving coplanarity of the lower ends of the probe tips. The probe head may be used for testing devices other than SAW devices.

What is claimed is:

1. A wafer probe head comprising:
   a plate-form support member having a tip region and an opposing mounting region for cantilever mounting on a wafer prober and being of uniform thickness throughout,
   means carried by said support member at said tip region for contacting a device under test, said contact means providing a constant impedance between the tip region and the device under test,
   connection means carried by said support member at a location spaced from said tip region for connection to a measurement instrument,
   conductor means connecting the contacting means to the connection means such that the constant impedance is maintained between the connection means and the device under test, and
   means for measuring physical distortion of the support member as a result of the contacting means being pressed against a stationary object by virtue of relative movement between the mounting region and the stationary object.

2. A wafer probe head comprising:
   a plate-form support member having a tip region and an opposing mounting region for cantilever mounting on a wafer prober and being of uniform thickness throughout;
   at least four probe tips carried by the support member at the tip region, each probe tip having a probe surface for engaging a device under test, said probe surfaces being essentially coplanar and said probe tips being configured to provide a constant impedance between the tip region and the device under test;

connection means carried by said support member at a location spaced from said tip region for connection to a measurement instrument; and conductor means connecting the probe tips to the connection means such that the constant impedance is maintained between the connection means and the device under test.

3. A wafer probe head according to claim 2, wherein the plate-form support member has first and second main faces and wherein the wafer probe head further comprises means for measuring physical distortion of the support member as a result of the contacting means being pressed against the device under test by virtue of relative movement between the mounting region and the device under test.

4. A wafer probe head according to claim 3, whrein said support member is made of dielectric material and the measuring means is a film transducer strain gauge in direct adhesive relationship with the dielectric material on the first main face, the strain gauge having a longitudinal direction that extends substantially parallel to the direction between the tip region and the mounting region.

5. A wafer probe head according to claim 2, wherein the support member has first and second main faces and is made of dielectic material and the conductor means comprise a conductive ground plane on the second main face of the support member and a stripline conductor on the first main face of the conductor.

6. A wafer probe head according to claim 2, wherein said probe surfaces are non-collinear.

7. A wafer probe head according to claim 2 wherein two of said probe tips are electrically connected to a ground plane on one face of the support member and the other two of said probe tips are electrically connected to respective stripline conductors on the opposing face of the support member to form at least two transmission line pairs between the tip region and the device under test, the ground plane and stripline conductors electrically connecting said probe tips to at least two respective connection means, the spacing of the probe tips being such as to assure the constant impedance between the connector means and the probe surfaces.

* * * * *